(12) United States Patent
Eto

(10) Patent No.: US 12,074,076 B2
(45) Date of Patent: Aug. 27, 2024

(54) PLASMA PROCESSING APPARATUS AND PLASMA PROCESSING METHOD

(71) Applicant: Hitachi High-Tech Corporation, Tokyo (JP)

(72) Inventor: Soichiro Eto, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 17/279,810

(22) PCT Filed: Mar. 11, 2020

(86) PCT No.: PCT/JP2020/010441
§ 371 (c)(1),
(2) Date: Mar. 25, 2021

(87) PCT Pub. No.: WO2021/181545
PCT Pub. Date: Sep. 16, 2021

(65) Prior Publication Data
US 2022/0406667 A1 Dec. 22, 2022

(51) Int. Cl.
*H01L 21/66* (2006.01)
*G01B 11/06* (2006.01)
(Continued)

(52) U.S. Cl.
CPC .............. *H01L 22/26* (2013.01); *G01B 11/06* (2013.01); *G01B 11/0625* (2013.01);
(Continued)

(58) Field of Classification Search
None
See application file for complete search history.

(56) References Cited

U.S. PATENT DOCUMENTS

| 6,160,621 A | 12/2000 | Perry et al. |
| 2003/0043383 A1 | 3/2003 | Usui et al. |

(Continued)

FOREIGN PATENT DOCUMENTS

| JP | H09126991 A | 5/1997 |
| JP | H11260799 A | 9/1999 |

(Continued)

OTHER PUBLICATIONS

Search Report mailed Jun. 9, 2020, in corresponding International Application No. PCT/JP2020/010441.
Written Opinion mailed Jun. 9, 2020, in corresponding International Application No. PCT/JP2020/010441.
Office Action mailed Jul. 20, 2022 in Korean Application No. 2021-7001576.

*Primary Examiner* — Jiong-Ping Lu
(74) *Attorney, Agent, or Firm* — Miles & Stockbridge, P.C.

(57) ABSTRACT

A plasma processing apparatus and method with an improved processing yield, the plasma processing apparatus including detector configured to detect an intensity of a first light of a plurality of wavelengths in a first wavelength range and an intensity of a second light of a plurality of wavelengths in a second wavelength range, the first light being obtained by receiving a light which is emitted into the processing chamber from a light source disposed outside the processing chamber and which is reflected by an upper surface of the wafer, and the second light being a light transmitted from the light source without passing through the processing chamber; and a determination unit configured to determine a remaining film thickness of the film layer by comparing the intensity of the first light corrected using a change rate of the intensity of the second light.

10 Claims, 8 Drawing Sheets

(51) Int. Cl.
  *H01J 37/22*      (2006.01)
  *H01J 37/244*     (2006.01)
  *H01J 37/32*      (2006.01)
  *H01L 21/3065*    (2006.01)
  *H01L 21/67*      (2006.01)

(52) U.S. Cl.
  CPC ...... *G01B 11/0633* (2013.01); *G01B 11/0666* (2013.01); *G01B 11/0683* (2013.01); *H01J 37/22* (2013.01); *H01J 37/244* (2013.01); *H01J 37/32082* (2013.01); *H01J 37/32917* (2013.01); *H01J 37/32926* (2013.01); *H01J 37/32963* (2013.01); *H01J 37/32972* (2013.01); *H01L 21/3065* (2013.01); *H01L 21/67253* (2013.01); *H01L 22/12* (2013.01); *H01J 2237/2445* (2013.01); *H01J 2237/24578* (2013.01); *H01J 2237/3343* (2013.01)

(56) References Cited

U.S. PATENT DOCUMENTS

| | | |
|---|---|---|
| 2007/0202613 A1 | 8/2007 | Usui et al. |
| 2008/0020495 A1 | 1/2008 | Usui et al. |
| 2008/0216956 A1 | 9/2008 | Nakamoto et al. |
| 2012/0101621 A1 | 4/2012 | Usui et al. |
| 2018/0277377 A1 | 9/2018 | Eto et al. |
| 2020/0043710 A1* | 2/2020 | Meng ................ H01J 37/32449 |

FOREIGN PATENT DOCUMENTS

| | | |
|---|---|---|
| JP | 2004507070 A | 3/2004 |
| JP | 2007234666 A | 9/2007 |
| JP | 2008218898 A | 9/2008 |
| JP | 2018157120 A | 10/2018 |
| KR | 10-1409682 B1 | 6/2014 |

* cited by examiner

[FIG. 2]
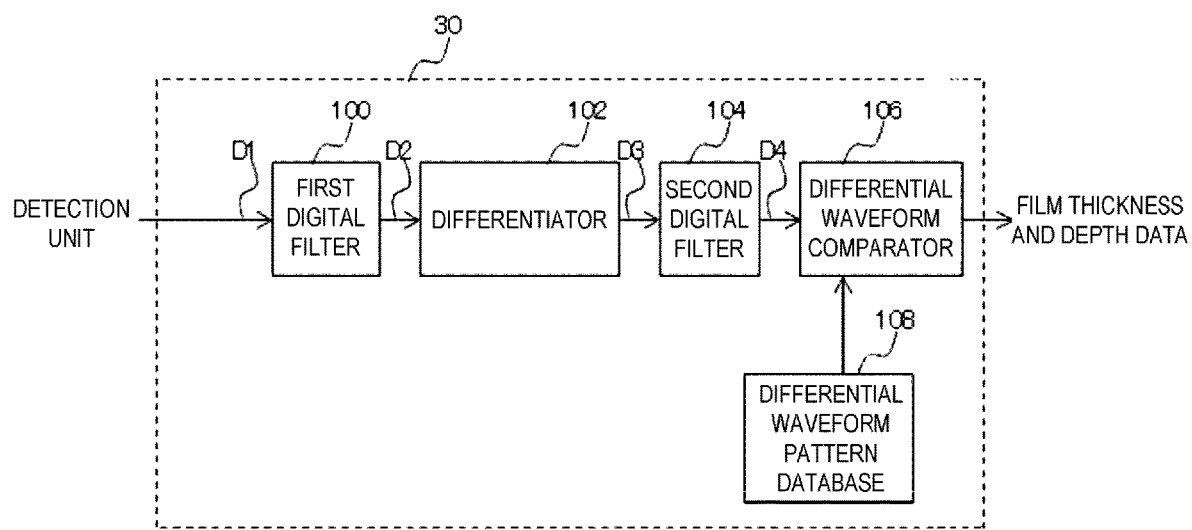

[FIG. 6]
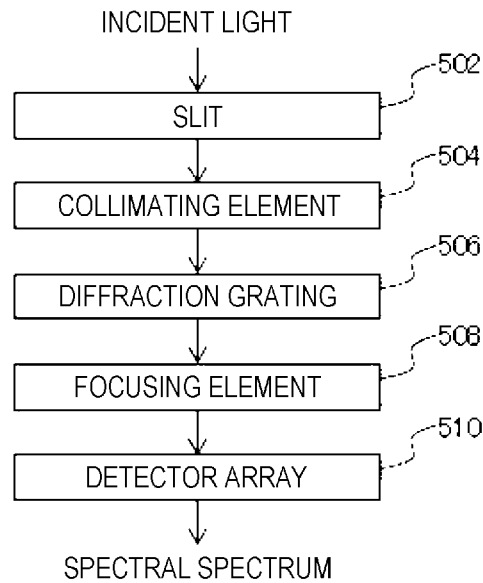
[FIG. 7]
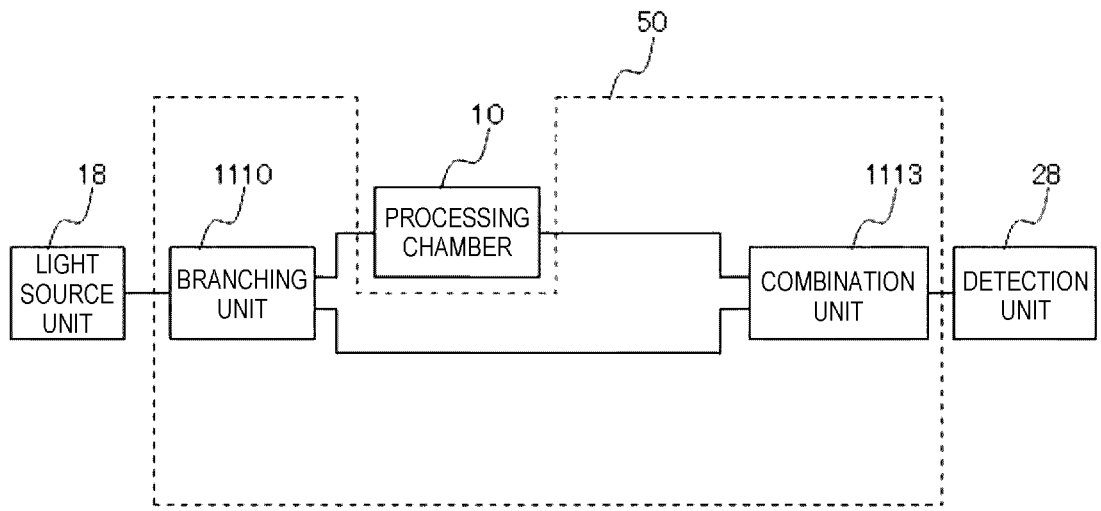

PLASMA PROCESSING APPARATUS AND PLASMA PROCESSING METHOD

TECHNICAL FIELD

The present invention relates to a plasma processing apparatus or a plasma processing method of processing a sample such as a semiconductor wafer on a substrate in a processing chamber inside a vacuum container using plasma generated in the processing chamber, and particularly relates to a plasma processing apparatus or a plasma processing method of adjusting processing on the sample by using a result obtained by detecting a remaining thickness or a processing amount of a film to be processed on the sample during the processing, and a detection device or a detection method for the detection.

BACKGROUND ART

In a process of manufacturing a semiconductor device, a circuit structure such as various components and wiring for interconnecting the various components are formed on a surface of a sample such as a semiconductor wafer on a substrate. In a process of forming the circuit structure such as these components and the wiring, generally, film formation of various materials such as a conductor, a semiconductor, and an insulator, or removal of an unnecessary part is repeated.

In a process of removing such an unnecessary part, dry etching using plasma is widely used. The plasma etching is performed by introducing a processing gas into a processing chamber disposed inside a vacuum container constituting an etching device, supplying radio frequency power from a radio frequency power source into the processing chamber, plasmaizing atoms and molecules of the gas, and exposing the sample to the plasma. In the etching processing using the plasma, isotropy or anisotropy of the processing is different depending on sputtering of ions in the plasma or a chemical reaction of a radical, and the circuit structure of the components and the wiring described above can be formed on the wafer surface with a high accuracy to a desired dimension by using the processing.

If a processed shape of the circuit formed by the etching processing deviates significantly from a desired one, a function of the manufactured semiconductor device will be impaired. Therefore, a detection technique (process monitoring technique) has been proposed in the related art to accurately detect a state during the processing in order to accurately perform the processing, and to reflect a result thereof in adjustment of a processing condition to reduce a variation in the processed shape and stabilize the processing. For example, a technique of detecting a change in an intensity of a light obtained by receiving a light reflected by the surface of the wafer that is being processed to detect an etching amount such as a remaining thickness of a film to be processed on the wafer surface or a depth of a groove or a hole formed in the wafer has been used as a film thickness and depth monitor to determine an endpoint of the etching processing.

Examples of such a technique in the related art include a technique described in JP-A-11-260799 (PTL 1) in the related art. In the related art, etching processing is ended by detecting a remaining film thickness of a film to be processed on a sample such as a semiconductor wafer or a depth of a groove or a hole formed by etching using a plasma light as a light source, and detecting a time point immediately before the film to be processed is completely removed. Further, it is disclosed that after the detection, conditions for etching a part to be processed and a part not to be processed are switched at a high selection manner to perform the etching processing, and thus an overall processing time can be kept short and a variation in the processing in an in-plane direction of the wafer can be reduced.

JP-T-2004-507070 (PTL 2) discloses that by using an external light source as a light source for emitting a light to a sample such as a semiconductor wafer instead of the plasma light, light amount fluctuation of the light source is reduced and a film thickness or a depth can be detected with high accuracy.

Further, with progress of high functionality of the device, miniaturization of a structure and complication of a layout, higher accuracy processing is required for an etching process of an advanced device. In the etching of the advanced device, a region to be etched may be small (low opening ratio), or an etching speed may be low (low etching rate). In endpoint determination of these processes, a light amount time change (interference signal) of each wavelength, which is a signal used for the end point determination, is small.

Therefore, in order to implement highly accurate end point determination, it is necessary to reduce a noise component generated due to fluctuation in a light amount with transition of time. A reason of the noise generated due to the fluctuation in the light amount includes a light amount fluctuation of a light source of a light emitted on the sample. In order to solve such a problem, a technique for reducing an adverse effect of the noise includes techniques disclosed in JP-A-2007-234666 (PTL 3) and JP-A-2008-218898 (PTL 4) in the related art.

These related arts disclose a technique in which a spectral spectrum obtained by detecting an intensity of a light for each of a plurality of predetermined wavelengths at each sampling time point during etching processing is compared with that at a previous sampling time point so as to detect a magnitude of a change in a light amount for each wavelength, and when it is determined that the change in the light amount is in the same direction at all the plurality of wavelengths and an amount of the change exceeds a predetermined threshold, it is determined that the noise of the fluctuation in the light amount occurs and the obtained light amount is corrected. Further, the correction of the light amount is performed by calculating a change magnification of the light amount at the sampling time point at which the occurrence of the noise is detected, and dividing measurement data after the current time point by the change magnification.

By using such a technique, an accuracy of the end point determination of the etching processing is improved in the related art.

CITATION LIST

Patent Literature

PTL 1: JP-A-11-260799
PTL 2: JP-T-2004-507070
PTL 3: JP-A-2007-234666
PTL 4: JP-A-2008-218898

SUMMARY OF INVENTION

Technical Problem

However, in the related art, problems rise since consideration on the following points is insufficient. That is, the fluctuation in the light amount from an external light source may include not only a step-shaped fluctuation but also a pulse-shaped change or a gentle drift-shaped fluctuation. It is found that these fluctuations have various patterns depending on a type and a degradation state of the light source.

FIG. 4A-4B shows an example of a change of an interference light from a film structure on a substrate-shaped sample (hereinafter referred to as a wafer) such as a semiconductor wafer with respect to a change in time. FIGS. 4A-4B and 5A-5B are graphs showing changes in an intensity of the interference light, obtained by detecting the interference light reflected and generated in the film structure formed of a plurality of film layers including a film layer to be processed disposed in advance on the wafer surface during processing in which the film layer to be processed in the film structure is etched with, respect to a change in time.

FIG. 5A shows, in particular, for three wavelengths ($\lambda 1$, $\lambda 2$, and $\lambda 3$) among a plurality of wavelengths of the interference light during the etching, a change in an intensity of a signal indicating the light amount with respect to a change in time by a graph in a case where a pulse-shaped noise occurs in the detected light amount. In FIG. 5A, a rapid fluctuation (an increase and a decrease) in the light amount occurs in the vicinity of a time point 20 sec (hereinafter, referred to as s), and a solid line and broken lines each indicating the light amount have a sharp peak. The fluctuation in the signal indicating the light amount in such a case, as the noise component, reduces the accuracy of a film thickness or a depth that is to be obtained based on the signal.

On the other hand, FIG. 4B shows that the pulse-shaped noise is removed from data indicating the light intensity shown in FIG. 4A by using the technique disclosed in PTL 3. Although the noise indicating the fluctuation in the light amount having the sharp peak at the time point 20 s shown in FIG. 4A is reduced, the noise is not completely removed. Therefore, an accurate value cannot be detected even if a remaining film thickness or the etching depth is detected using a result obtained by such a correction.

Further, even in a case where the noise generated due to the fluctuation in the light amount is step-shaped, when a change amount thereof is small, the noise cannot be removed sufficiently in the related art. FIG. 5A shows a result obtained by detecting the intensity of the interference light in a case where a small step-shaped noise is generated in the light amount of the interference light. The small step-shaped noise is generated in the vicinity of a period from a sampling time point 15 to a sampling time point 20, and it is difficult to clearly distinguish between the change in the light amount due to the etching and the change due to the noise at the wavelengths $\lambda 2$ and $\lambda 3$.

FIG. 5B shows a result obtained by removing the noise, generated due to such a step-shaped fluctuation in the light amount, by using the technique of PTL 3 for the signal indicating the intensity of the interference light in which the noise occurs. Although the noise is removed from the interference light of the wavelength $\lambda 1$ in which a component of the change due to the noise of the fluctuation in the light amount can be clearly distinguished, as a result of removing the noise in $\lambda 2$ and $\lambda 3$, a strain occurs in which the light amount changes upwards to a right side at $\lambda 2$ and the light amount changes downward to a right side at $\lambda 3$.

This is because the light amount change accompanying the wafer etching and the step-shaped light amount fluctuation noise are not separated, and a light amount change obtained by combining these changes is detected as the noise and corrected. Therefore, even for the step-shaped noise, it is difficult to implement accurate correction of the light amount fluctuation noise with the noise correction technique related to the fluctuation in the light amount in the related art.

In this way, in the related art, since it is difficult to accurately remove the noise component indicating the fluctuation in the light amount from the signal indicating the intensity of the interference light, the accuracy of the remaining film thickness or the etching processing amount, or the accuracy of the processing end point determination during the processing is impaired. Therefore, there is a problem that a yield of the processing is impaired. An object of the invention is to provide a plasma processing apparatus or a plasma processing method in which a yield of processing is improved by measuring a remaining film thickness or a processing amount with high accuracy.

Solution to Problem

The object described above is implemented by providing a plasma processing apparatus configured to process, using plasma generated in a processing chamber inside a vacuum container, a film layer to be processed on a wafer disposed in a processing chamber, and the plasma processing apparatus includes a detector configured to detect, during processing of the wafer, an intensity of a first light of a plurality of wavelengths in a first wavelength range and an intensity of a second light of a plurality of wavelengths in a second wavelength range which includes at least one wavelength different from each of the plurality of wavelengths in the first wavelength range, the first light being obtained by receiving a light emitted to the processing chamber from a light source disposed outside the processing chamber and reflected by an upper surface of the wafer, and the second light being a light transmitted from the light source without passing through the processing chamber; and a determination unit configured to determine a remaining film thickness of the film layer by comparing the intensity of the first light in the first wavelength range, that is obtained during the processing and corrected by using a change rate of the intensity of the second light in the second wavelength range, with a pattern data which is obtained in advance and indicates a correlation between an intensity of a light and a remaining film thickness of the film layer where a wavelength is used as a parameter.

Advantageous Effect

According to the film thickness and depth measurement of the invention, it is possible to always implement highly accurate film thickness and depth measurement without being affected by light amount fluctuation noise during the etching.

Technical problems, configurations, and effects other than those described above will be obvious by the following description of embodiments.

BRIEF DESCRIPTION OF DRAWINGS

FIG. 2 is a diagram schematically showing an outline of a configuration of a film thickness and depth calculation unit of the plasma processing apparatus according to the embodiment shown in FIGS. 1A and 1B.

FIG. 6 is a block diagram showing a detection principle of a spectroscope using a diffraction grating.

FIG. 7 is a block diagram schematically showing an outline of a configuration for detecting a light amount, which indicates a sample processing state, using a light emitted to a vacuum processing chamber of a plasma processing apparatus according to another embodiment of the invention.

DESCRIPTION OF EMBODIMENTS

Figure 1A:
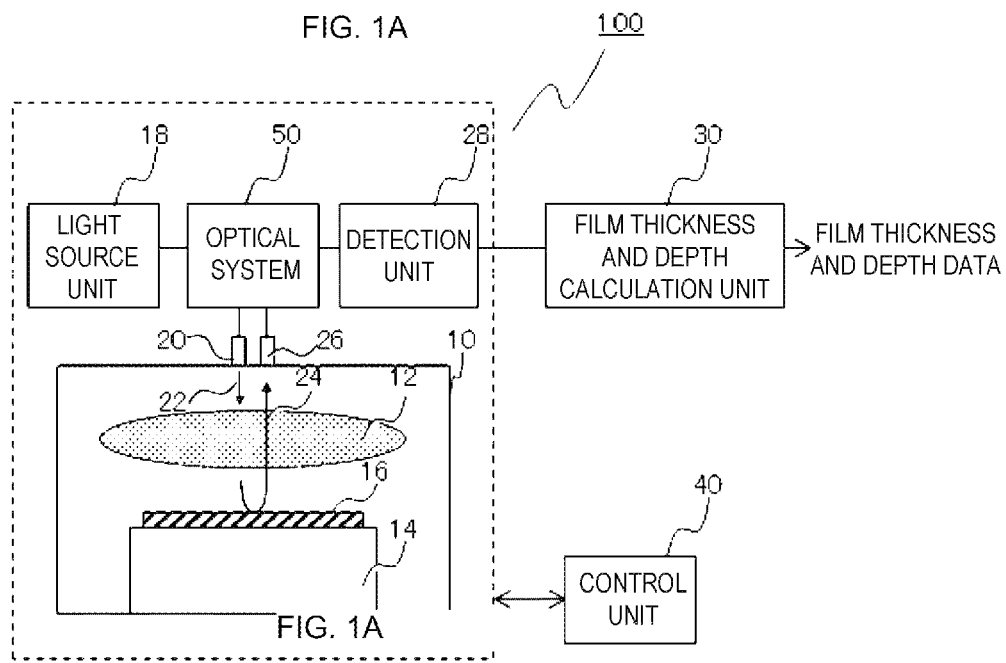
FIGS. 1A and 1B are diagrams schematically showing an outline of a configuration of a plasma processing apparatus according to an embodiment of the invention.

In a plasma processing apparatus that processes a semiconductor wafer, which is a substrate-shaped sample to be processed in a processing chamber inside a vacuum container, using plasma generated in the processing chamber, since a processing amount and a remaining film thickness of the wafer are detected using a result obtained by detecting a light from a wafer surface, there is a problem that the accuracy of the light detection is impaired because a light amount of a light source that is disposed outside the vacuum container and emits the light to the wafer in the processing chamber fluctuates. On the other hand, even when the light amount of the light source changes, the light emitted from the external light source disposed outside the vacuum container is branched, one of the branches is emitted to the processing chamber, the emitted light (including a light that is emitted on an upper surface of the wafer and reflected by the upper surface) is detected, and the other is detected by another detector without passing through the processing chamber so as to detect a fluctuation amount of the light amount from the light source. Then, a technique has been considered in which a detection result of another detector that detects the other branched light is used to correct a detection result of one detector that detects the light from the processing chamber.

However, in this technique, a fluctuation in the light amount of the light source, which is disposed outside the processing chamber, included in a detection result of the light from the wafer to be processed cannot be accurately corrected. This is because in order to accurately detect the fluctuation in the light amount with another detector, in the configuration described above, that the light is required to be detected at the same time point with the detector such as a spectroscope that detects the light from the processing chamber and the detector that receives the branched light without passing through the processing chamber and extracts the fluctuation in the light amount. On the other hand, each detector incudes a mechanism that outputs a time point with a specific clock oscillator inside the detector and operates referring to the time point, even when a common signal from an outside of the detector is used as a trigger, the detectors cannot measure light amount data at exactly the same time point.

Further, each detector always has an individual variation, even when a set value such as an exposure time and the number of averaging is unified, the detected fluctuation amount of the light amount differs due to a difference in a sensitivity characteristic, and the fluctuation in the light amount cannot be corrected by using the fluctuation amount. For example, a case is considered where the light amount fluctuation is measured with a spectrometer different from one used for measurement of a reflected light.

FIG. 6 is a block diagram showing a detection principle of a spectroscope using a diffraction grating. The spectroscope includes, as components, a slit 502, a collimating element 504, a diffraction grating 506, a focusing element 508, and a detector array 510. After a light emitted on the slit 502 is input to the configuration described above in an order described above, a spectrum of the emitted light is detected. Each of these components has an individual variation. Therefore, a relationship between each detector of the detector array 510 that outputs a signal indicating the spectrum and a wavelength is different for each spectroscope, and it is difficult to correct, using data of a spectroscope used for detecting the fluctuation in the light amount, data of a spectroscope used for detecting a reflectance.

Further, a correlation between an emitted light amount and an output voltage is unique to each spectroscope due to the individual variation in the detector array 510. Therefore, when the spectroscopes are different, the fluctuation amount of the same light amount is observed as a different fluctuation amount of the light amount depending on the spectroscopes. From this point, it is also difficult to correct the light amount fluctuation of measurement data by using different spectroscopes.

An object of the invention is to solve the problems described above, and embodiments thereof will be described below with reference to the drawings. Hereinafter, a configuration of a plasma processing apparatus including a film thickness and depth measurement unit and performing etching processing will be described, and then a film thickness and depth measurement method during the etching processing in the plasma processing apparatus will be described as an embodiment of the invention.

First Embodiment

Figure 1B:
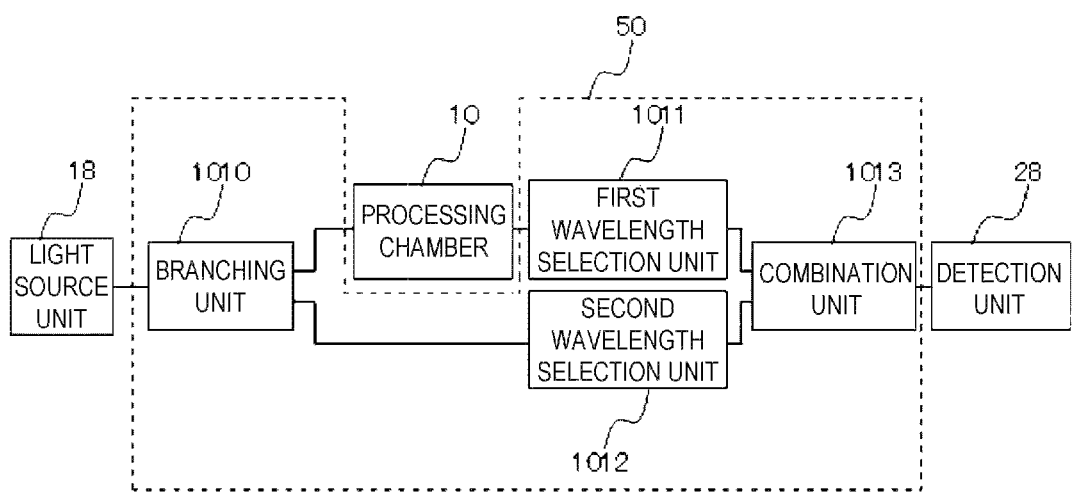

A first embodiment of the invention will be described below with reference to FIGS. 1A-1B to 3A-3C. FIGS. 1A and 1B are diagrams schematically showing an outline of a configuration of a plasma processing apparatus according to the embodiment of the invention. FIG. 1A schematically shows the outline of the overall configuration of the plasma processing apparatus according to the present embodiment. FIG. 1B is a block diagram schematically showing an outline of a configuration for detecting a light amount, which indicates a sample processing state, using a light emitted into a vacuum processing chamber of the plasma processing apparatus according to the present embodiment.

FIG. 1A shows the outline of the overall configuration of the plasma processing apparatus according to the present embodiment. A plasma processing apparatus 100 includes a processing chamber 10 that is a space disposed inside a vacuum container. Inside the processing chamber 10, atoms or molecules of an etching processing gas introduced from a gas introduction unit (not shown) are supplied with a radio frequency electric field from a radio frequency power source (not shown) or an electric field or a magnetic field of a microwave oscillated and propagated by a magnetron, and are excited and ionized or dissociated to form plasma 12. The plasma 12 is supplied to an upper surface of a wafer 16 such as a semiconductor wafer that is placed and held on an upper surface of a sample table 14, and a film to be processed on the upper surface of the wafer 16 is etched (plasma-processed).

In the present embodiment, operations such as introduction of the gas into the processing chamber 10, generation and supply of the electric field and the magnetic field for generating the plasma 12 and control for an intensity and distribution thereof, and increase and decrease of a bias potential formed on the wafer 16 by the radio frequency power supplied from the radio frequency power source (not shown) to an electrode inside the sample table 14, are performed in response to a command signal from a control unit 40 that is communicably connected to each device of each unit of the plasma processing apparatus 100 such as the power supply and the electrode that generate the electric field and the magnetic field. Synchronization and timing adjustment among the devices is performed by transmitting the timely command signal from the control unit 40 so as to obtain a result of desired etching processing.

The plasma 12 of the present embodiment is pulsed by repeating ignition and disappearance (digestion) state, that is, a so-called on/off state at each interval in each predetermined cycle interval. At this time, the plasma 12 is pulsed by switching on/off based on modulation of such as voltage application from the radio frequency power source that plasmaizes the etching gas and microwave emission. In the present example, the control unit 40 also adjusts a length of each on/off period by the pulsing and an intensity and distribution of the plasma during an on period. Further, the introduction of the processing gas supplied into the processing chamber 10 is performed in different periods for each different flow rate, and the plasma 12 is also plused by performing a time modulation in which a combination of these different periods as one cycle is repeated a plurality of times.

The plasma processing apparatus 100 includes a mechanism that detects a remaining film thickness or a processing amount (etching depth) of the film to be processed during the processing of the wafer 16. That is, a light emitted from a light source unit 18 disposed outside the processing chamber 10 is introduced into an optical system 50, is transmitted through an optical fiber to an introduction lens 20 disposed at a position facing the upper surface of the wafer 16 from above the upper surface, and is introduced into the processing chamber 10 from a lower end surface of the introduction lens 20 toward the wafer 16 held on the lower sample table 14. The light from the light source unit 18 emitted downward from the introduction lens 20 as an emission body is emitted as an emitted light 22 to the wafer 16 in the processing chamber 10. The light emitted from the light source unit 18 of the present embodiment is a continuous light in which a wavelength or a frequency in a range from ultraviolet to infrared is continuously included. However, the film thickness or the depth may be detected using one or more specific wavelengths, and in this case, a light source that emits the specific wavelength may be used.

The emitted light 22 emitted to the wafer 16 is transmitted to the optical system 50 through a detection lens 26 as a light receiver and the optical fiber optically connected to the detection lens 26 as a reflected light 24 reflected by a surface and a bottom surface (a lowermost surface of the film layer to be processed or a boundary surface with another adjacent film layer below the film layer) of the film layer to be processed on the surface of the wafer 16, and is further introduced into a detection unit 28. The detection unit 28 includes a spectroscope, and the introduced light is divided (dispersed) for each predetermined frequency or each predetermined wavelength, and an intensity or an amount of the divided light is detected for each wavelength. When the remaining film thickness is detected using the specific wavelength, the detector is not limited to the spectroscope and a photodetector may be used. In this case, when the light introduced into the detection unit 28 is only light of the desired specific wavelength, the photodetector may be used directly. When the continuous light of the plurality of wavelengths is introduced, a mechanism such as a monochromator that selects only the specific wavelength may be disposed in front of the photodetector.

The reflected light 24 reflected by the film layer to be processed on the upper surface of the wafer 16 of the present example is received by the detection lens 26 as an interference light that is reflected by at least two surfaces having a distance in a vertical direction and in which a light reflected by one surface interferences with a light reflected by the other surface. In the interference light, as the etching processing of the film layer to be processed progresses and the remaining film thickness decreases, an intensity of the interference light of the plurality of wavelengths repeatedly increases or decreases periodically. In the present embodiment, the remaining film thickness or the etching depth is detected by detecting a change of the intensity of the interference light of the plurality of wavelengths over time.

In the present example shown in FIG. 1A, the introduction lens 20 that introduces the light into the processing chamber 10 and the detection lens 26 that detects the reflected light are disposed at positions spaced apart from each other with a distance in a horizontal direction shown in a left-right direction of the drawing. In a case of this configuration, in order to most efficiently detect the reflected light 24, it is desirable to dispose the introduction lens 20 and the detection lens 26 to be inclined so as to face the same light beam.

The configurations of the introduction lens 20 and the detection lens 26 are not limited to those shown in FIGS. 1A and 1B, and as a coaxial configuration, the introduction lens 20 and the detection lens 26 may be one shared lens. In this case, the one common lens is disposed above the wafer 16 such that a direction of the light beam is perpendicular to the upper surface of the wafer 16, and can detect the light that is vertically emitted and vertically reflected.

FIG. 1A shows one pair of introduction system of the external light 18 and detection system of the reflected light 24, and a plurality of pairs of the systems are provided when the film thickness and depth are measured at a plurality of positions of the wafer 16. Further, a case where the light from the external light source unit 18 as the light source is emitted into the processing chamber 10 is described with reference to FIG. 1A, but when a light of the plasma 12 is used as the light source, the light source unit 18 may not be used. When the plasma 12 is used as the light source, the light emitted from the plasma 12 is also reflected by the wafer 16, and the reflected light 24 is also detected in the same manner as when the light source unit 18 is used.

Here, the optical system 50 can detect the reflected light 24 and the light for detecting the fluctuation in the light amount. That is, the optical system 50 shown in FIG. 1B includes a plurality of element blocks. The light emitted from the light source unit 18 is received by a branching unit 1010 and then branched into lights along two paths. The light along one path is emitted onto and reflected by the upper surface of the wafer 16 inside the processing chamber 10 as the emitted light 22. The reflected light is introduced into the optical system 50 from the detection lens 26 as the reflected light 24, and then is input to a first wavelength selection unit 1011 and filtered to extract that in a first wavelength range. The other branched light is input to a second wavelength selection unit 1012 without being introduced into the processing chamber 10, and is filtered to extract that in a second wavelength range. The lights from these wavelength selection units are transmitted to a combination unit 1013, and a signal of a result of the combination is input to the detection unit 28.

In such a configuration, the branching unit 1010 uses, for example, a half mirror or a branch fiber, to separate light into two parts each of which has the same spectrum distribution. Wavelength filters are used in the first wavelength selection unit 1011 and the second wavelength selection unit 1012, and a specific wavelength range is filtered respectively. A half mirror or a branch fiber is used in the combination unit 1013, and the lights including a combination of different wavelengths output from the two wavelength selection units are combined into a light. With the present configuration, the light that is introduced into the processing chamber 10 and is transmitted as the reflected light 24 reflected by the wafer 16 and the light received without passing through the processing chamber 10 have a plurality of wavelengths distributed in different ranges, and these lights are combined by the combination unit 1013 and then detected by one detection unit 28.

In the present embodiment, in the optical system 50, the branching unit 1010 and the second wavelength selection unit 1012 are connected only by the optical fiber, and the light output from the branching unit 1010 is introduced into the second wavelength selection unit 1012 substantially without deterioration except for that caused by the optical fiber. Similarly, the detection lens 26 and the first wavelength selection unit 1011 are also connected by one or more optical fibers and are optically connected, and the light transmitted therebetween is introduced into the first wavelength selection unit 1011 substantially without deterioration except for that caused by the optical fiber.

Data of a result detected by the detection unit 28 is transmitted as a signal to the film thickness and depth calculation unit 30, and the film thickness and depth is detected. A configuration of a functional block of the film thickness and depth calculation unit 30 is shown in FIG. 2. FIG. 2 is a diagram schematically showing an outline of the configuration of the film thickness and depth calculation unit of the plasma processing apparatus according to the embodiment shown in FIGS. 1A and 1B. In FIG. 2, the film thickness and depth calculation unit 30 is shown as a block diagram in which functional blocks of units each having a predetermined operation are connected.

Time-series data D1 indicating a light amount of each wavelength transmitted from the detection unit 28 to the film thickness and depth calculation unit 30 is smoothed by a first digital filter 100, and is supplied to a differentiator 102 as first smoothed time-series data D2. In the differentiator 102, for example, differential time-series data D3 that is a differential coefficient value (a first-order differential value or a second-order differential value) is calculated using a so-called savitzky-golay method (S-G method), and is supplied to a second digital filter 104. The second digital filter 104 smoothes the differential time-series data D3 and supplies second smoothed time-series data D4 to a differential comparator 106.

Here, the calculations of the data D2, D3, and D4 will be described. As the first digital filter 100, for example, a second-order Butterworth type low-pass filter is used. The first smoothed time-series data D2 is obtained by the following equation using a second-order Butterworth type low-pass filter.

$$D2(i)=b1 \cdot D1(i)+b2 \cdot D1(i-1)+b3 \cdot D1(i-2)-[a2 \cdot D2(i-1)+a3 \cdot D2(i-2)]$$

Here, Dk(i) represents data at a time point i of each data Dk, and each of coefficients b and a has different values depending on sampling frequencies and cut-off frequencies. Further, coefficient values of the digital filters are, for example, a2=−1.143, a3=0.4128, b1=0.067455, b2=−0.013491, and b3=0.067455 (the sampling frequency is 10 Hz, the cut-off frequency is 1 Hz).

The time-series data D3 of the differential coefficient value is calculated by the differentiator 102 as follows, for example, by using a polynomial fitting smoothing differential method of five pieces of time-series data D2.

$$D3(i)=\sum_{j=-2}^{j=2} wj \cdot D2(i+j)$$

Here, for a weighting coefficient w, for example, w-2=−2, w-1=−1, w0=0, w1=1, and w2=2 are used in a first-order differential calculation. Further, in a second-order differential calculation, for example, W-2=2, w-1=−1, w0=−2, w1=−1, and w2=2 are used.

As the second digital filter 104 in the calculation of the second smoothed time-series data D4 using the time-series data D3 of the differential coefficient value, calculation is performed as follows by, for example, a second-order Butterworth type low-pass filter.

$$D4(i)=b1 \cdot D3(i)+b2 \cdot D3(i-1)+b3 \cdot D3(i-2)-[a2 \cdot D4(i-1)+a3 \cdot D4(i-2)]$$

The data D4 introduced into the differential comparator 106 is compared with the previously acquired film thickness and depth and a differential waveform pattern database 108. In the differential waveform comparator 106, the second smoothed time-series data D4(i) indicating a differential waveform obtained based on a light amount D1(i) at the time point i is compared with a plurality of patterns of differential values of the light intensity, in each of which a wavelength is used as a parameter, in the differential waveform pattern database 108. Among the plurality of patterns, a pattern having a minimum difference, for example, having a minimum standard deviation, with a pattern of the time-series data at the time point i is obtained, and the film thickness and depth of the wafer 16 are determined based on a value of the remaining film thickness associated with the closest pattern in advance.

For example, the remaining film thickness corresponding to the closest pattern is determined to be the calculated remaining film thickness at the time point i. By using film thickness data stored inside a control unit or in a storage device communicably connected to the control unit as the calculated film thickness and a remaining film thickness at a sampling time point before the time point i, the remaining film thickness at the time point i is calculated by using a well-known mathematical method such as regression analysis, associated with the time point i, and stored in the storage device. Further, a value obtained by dividing the determined remaining film thickness from an initial film thickness of the film layer to be processed on the wafer 16 which is obtained in advance is detected as an etching amount (etching depth). The film thickness and depth are supplied to an outside from the film thickness and depth calculation unit 30, such as being transmitted, displayed on, and notified on a monitor or a display provided in the plasma processing apparatus 100.

FIG. 2 shows an example in which when a first-order differential value or a second-order differential value of the light amount change of each wavelength with respect to the film thickness of the film to be processed is acquired in advance, the first-order differential value or the second-order differential value of the light amount is acquired for each wavelength with respect to a time point of each detection result, the first-order differential value or the second-order differential value is compared with the data acquired in advance, and the value having a minimum difference is detected as the film thickness at the time point, but a method for detecting the remaining film thickness or the etching depth is not limited thereto.

For example, data of values of the remaining film thickness of the film to be processed on the wafer 16 or the etching depth and a reflectance for each wavelength corresponding to each value may be acquired in advance. The reflectance for each wavelength may be calculated using the result obtained by detecting the reflected light 24 from the wafer 16 at any time point i and the light amount for each wavelength of the light emitted from the light source unit 18. The calculated reflectance for each wavelength may be compared with the data acquired in advance, so as to specify the remaining film thickness or the depth corresponding to a value having a minimum difference in the data as the film thickness and depth at the time point i. Further, data of the values of the remaining film thickness of the film to be processed and the light amount for each wavelength of the light from the film to be processed corresponding to each value may be acquired in advance. The light amount for each wavelength at any time point i may be acquired based on the reflected light 24 from the wafer 16, a result of the light amount for each wavelength may be compared with the data acquired in advance, and the remaining film thickness corresponding to a value having a minimum difference from the data at the time point i among the data acquired in advance may be determined as the remaining film thickness at the time point i. Further, a method may be used in which data of the values of the remaining film thickness of the film to be processed and a first-order differential normalized value or a second-order differential normalized value obtained by normalizing, by the light amount, a first-order differential value or a second-order differential value of the change in the light amount for each wavelength of the reflected light 24 corresponding to each value is acquired in advance, the film thickness at the time point is specified by acquiring the first-order differential normalized value or the second-order differential normalized value of the light amount change for each wavelength from the detection result and comparing the first-order differential normalized value or the second-order differential normalized value with the data acquired in advance.

Figure 3A:
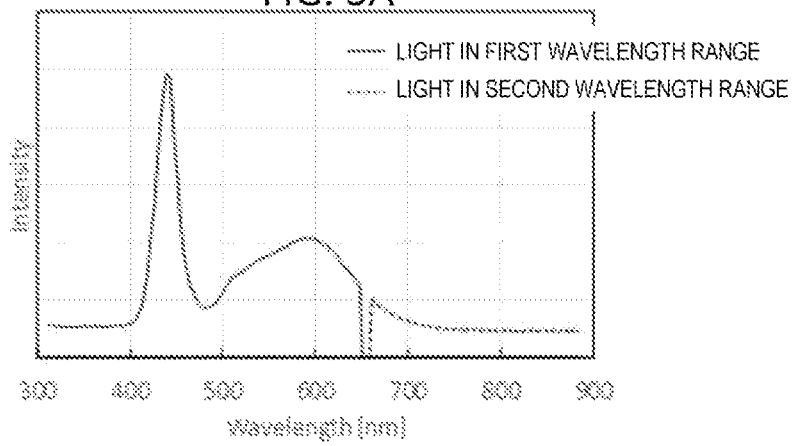
FIGS. 3A-3C are graphs showing an intensity of a light of a plurality of wavelengths from a wafer detected in the plasma processing apparatus according to the embodiment shown in FIGS. 1A and 1B.
Figure 3B:
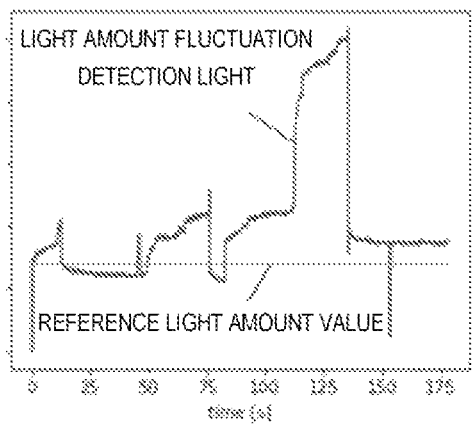
Figure 3C:
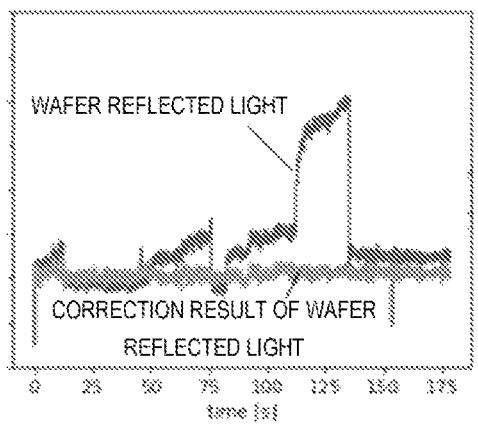
Figure 4A:
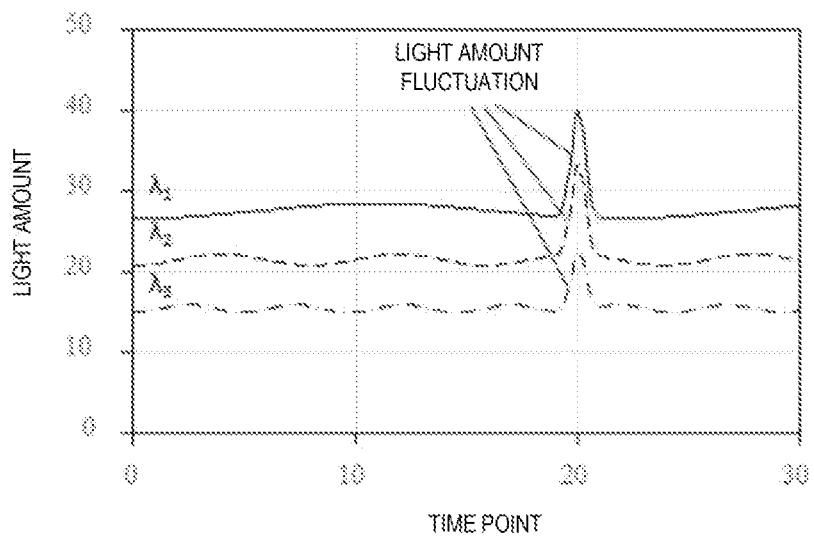
FIGS. 4A and 4B are graphs showing a change in an intensity of an interference light with respect to a change in time, and the intensity of the interference light is obtained by detecting the interference light reflected and generated in a film structure formed of a plurality of film layers including a film layer to be processed disposed in advance on a wafer surface during processing in which the film layer to be processed in the film structure is etched.
Figure 4B:
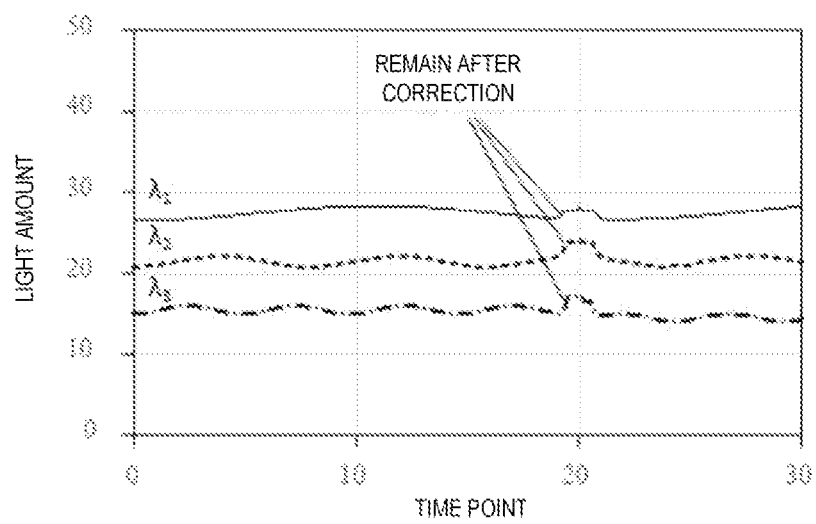
Figure 5A:
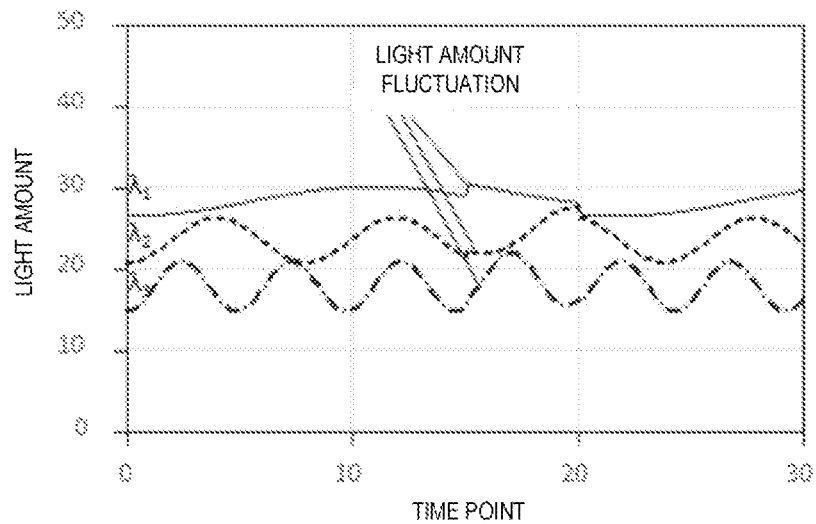
FIGS. 5A and 5B are graphs showing a change in an intensity of an interference light with respect to a change in time, and the intensity of the interference light is obtained by detecting the interference light reflected and generated in a film structure formed of a plurality of film layers including a film layer to be processed disposed in advance on a wafer surface during processing in which the film layer to be processed in the film structure is etched.
Figure 5B:
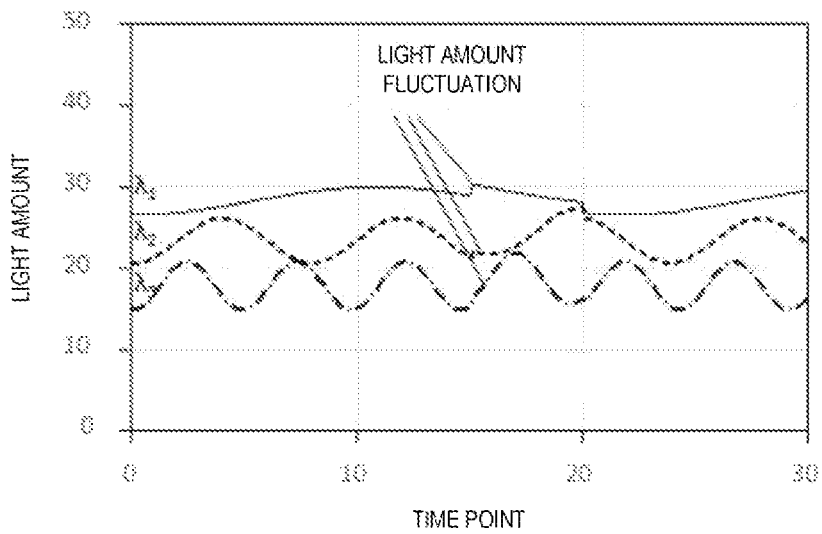

Detection results of the film thickness and depth obtained by correcting the fluctuation amount of the light amount of the plasma processing apparatus 100 having the configuration described above will be described with reference to FIGS. 3A-3C. FIGS. 3A-3C are graphs showing an intensity of a light of the plurality of wavelengths from the wafer detected in the plasma processing apparatus according to the embodiment shown in FIGS. 1A and 1B.

In the present example, an LED is used for the light source unit 18, and the first wavelength selection unit 1011 of the optical system 50 filters and removes or reduces a light of a wavelength of 650 nm or more, and the second wavelength selection unit 1012 filters and removes or reduces a light of a wavelength of 660 nm or less. That is, the first wavelength selection unit 1011 sets the light into a first wavelength range of less than 650 nm, and the second wavelength selection unit 1012 sets the light into a second wavelength range exceeding 660 nm. Further, adjustment of operations of the dispersion of the reflected light 24 in the optical system 50, selection and combination of each wavelength of the signal after the dispersion, processing including correction processing in the detection unit 28, and the calculation of the remaining film thickness or the depth in the film thickness and depth calculation unit 30 are performed based on transmission and reception of a monitoring signal and the command signal to and from the control unit 40 communicably connected thereto.

FIG. 3A is a graph showing an example of a spectrum at any time point indicating the light amount of the light combined by the combination unit 1013 via the first wavelength selection unit 1011 and the second wavelength selection unit 1012 at each of a plurality of sampling time points for each specific period determined in advance. The spectral spectrum is divided into front and back with a wavelength near 650 nm as a boundary, and the front and back includes a light in the first wavelength range in which the light passes the first wavelength selection unit 1011 after being received as the reflected light 24 and a light in the second wavelength range in which the light from the light source unit 18 passes the second wavelength selection unit 1012. As shown in FIG. 3A, it can be seen that the lights in the different wavelength ranges passing through these different paths are detected as data of the light amount associated with the same sampling time point.

In the present example, first, a spectrum of the light emitted from the light source unit 18 is detected as time-series data for each time point in a state in which the etching processing is not performed. In order to detect the fluctuation in the light amount, FIG. 3B shows a result obtained by plotting a change over time of a sum of the light amount of the light in the second wavelength range that passes the second wavelength selection unit 1012 and is detected by the detection unit without passing through the processing chamber 10 after being branched. As shown in FIG. 3B, it can be confirmed that the light amount of the light emitted from the light source unit 18 fluctuates in a step shape or a spike shape.

In the detection unit 28 of the present embodiment, any predetermined sampling time point shown in FIG. 3B is set to 0 and a value near the time point 0 is set as a reference light amount value, and a change rate of the light amount at each sampling time after the time point 0 with respect to the reference light amount value is calculated. For the calculation, an arithmetic unit, such as an MPU made of a semiconductor, disposed inside the detection unit 28 may be used, or an arithmetic unit disposed inside the control unit 40 communicably connected to the detector 28 may be used.

FIG. 3C shows a change overtime of a light amount of a light of a wavelength of 550 nm included in the first wavelength range of the reflected light 24. As shown in FIG. 3C, it can be seen that the light amount at a specific wavelength of the reflected light 24 also increases or decreases in the same direction at the same time point as in FIG. 3B, that is, fluctuates in a similar tendency. In the detection unit 28, the light amount of the reflected light 24 is corrected by dividing the value (value of each wavelength of the spectral spectrum) of the light amount of each of the plurality of wavelengths within the first wavelength range of the reflected light 24 as shown in FIG. 3C at any sampling time point by the light amount change rate at any sampling time point calculated using the data of FIG. 3B.

A result of this correction is shown in FIG. 3C as a correction result of the reflected light. As shown in FIG. 3C, it can be seen that, by performing the correction, the fluctuation in the light amount of the light emitted from the light source unit 18 which is included in the light amount of the light in the first wavelength range is corrected, the change in the light amount of the reflected light 24 of the wavelength of 550 nm shown at the time point 75 or a period of 110 to 125 is reduced, and the change is reduced over the entire period after 0 s at which the reflected light 24 is detected.

As described above, inventors uses a ratio (light amount change rate) between a sum of the light amount of the light of each wavelength in the second wavelength range detected by the detection unit 28 corresponding to each sampling time point and a value of a reference light amount to correct the light amount of the reflected light 24 obtained by being emitted from the light source unit 18 during the etching processing and reflected by the upper surface of the wafer 16. Further, the remaining film thickness or the etching depth is detected by the film thickness and depth calculation unit 30 using the spectral spectrum in which the light amount was corrected. As a target, a single-layer film of SiO2 formed in advance on a silicon wafer was etched, and an accuracy of detection at a film thickness of 100 nm was compared and evaluated.

It was found that when the correction of the present embodiment is not performed, an error in estimating the film thickness was about 1 nm, but the error was 0.1 nm or less by using the correction. From the results described above, it was found that, by using the correction of the light amount of the present embodiment, the fluctuation of the light amount of the light emitted from the light source unit 18 can be accurately detected, the remaining film thickness and depth can be detected with a high accuracy, and the yield of the processing can be improved.

Here, it is obvious that the light source, the dispersion measurement, a measurement condition, and a wafer condition used in the present embodiment are examples, and the invention of the present embodiment can be applied to configurations and conditions other than these. Further, the embodiment described above discloses an example in which in the detection unit 28, the value of the spectral spectrum of the light of each wavelength in the first wavelength range of the reflected light 24 which is selected by the first wavelength selection unit 1011 is corrected by performing the correction calculation of dividing the value by the light amount change rate obtained by using the sum of the light amounts of the lights of the wavelengths in the second wavelength range which are emitted from the light source unit 18 and selected by being introduced into the second wavelength selection unit 1012 without passing through the processing chamber 10. On the other hand, the correction can be performed such that the calculation of the correction is performed not only on the spectral spectrum of each wavelength included in the first wavelength range but also on the spectral spectrums of all the wavelengths introduced from the combination unit 1013 to the detection unit 28.

Further, the smoothed differential waveform time-series data D4 calculated based on each time-series data of the spectral spectrum used for the determination of the film thickness or the depth in the film thickness and depth calculation unit 30 may be appropriately selected by an user when only the light in the wavelength range of the first wavelength range which is transmitted from the detection unit 28 is used or lights including the lights in the first and second wavelength ranges are used. In either case, the wavelength range and the value of each wavelength are the same between each pattern data in the differential waveform pattern database 108 and the differential waveform time-series data D4 used for the determination.

The first wavelength range and the second wavelength range are selected such that at least the first wavelength range includes a wavelength range in which a change in the reflectance of the wafer 16 caused by the etching appears, and the second wavelength range includes a wavelength range in which a change in the reflectance of the wafer 16 caused by the etching does not appear. For example, the first wavelength range and the second wavelength range are selected such that the wavelength ranges do not overlap. At this time, the entire or a part of the second wavelength range may be used in the calculation of the light amount change rate in which the second wavelength range is used.

Further, the second wavelength range has a wavelength range overlapping with the first wavelength range, but may be set to have at least a wavelength range not included in the first wavelength range. At this time, the entire or a part of the wavelength range in the second wavelength range which is not included in the first wavelength range may be used in the calculation of the light amount change rate in which the second wavelength range is used.

Further, when the first wavelength range includes the wavelength range in which the wafer reflectance change caused by the etching does not appear, the second wavelength range is set to have at least the wavelength range in which the reflectance change of the wafer 16 caused by the etching does not appear. In this case, the entire or a part of the wavelength range in which the change in the reflectance of the wafer 16 caused by the etching in the second wavelength range may be used in the calculation of the light amount change rate in which the second wavelength range is used.

By determining the selection of the first wavelength range and the second wavelength range based on an etching target and characteristics of the external light source, a noise generated due to the fluctuation in the light amount can be corrected without deteriorating the signal of the reflected light 24, which is an object of the invention. For example, a wavelength range in which there is no change in the reflectance of the etching target or the change is substantially zero is set to be included in the second wavelength range, and is used to calculate the light amount change rate. At this time, the first wavelength range is set to include the wavelength range in which there is a change in the reflectance of the etching target. Accordingly, all wavelengths at which the change in the reflectance of the etching target can be observed can be acquired as signals, and the light amount fluctuation noise thereof can be accurately corrected.

Further, when there is a wavelength unnecessary for the measurement of the reflected light 24 because the light amount is high or low in the spectrum of the light from the light source unit 18, the wavelength may be set to be included in the second wavelength range and used for the calculation of the light amount change rate. At this time, the first wavelength range is set to include wavelengths other than the unnecessary wavelength. Accordingly, all wavelengths required for observing the reflectance change of the etching target can be acquired as the signals, and the light amount fluctuation noise thereof can be accurately corrected.

The calculation of the light amount change rate in which the second wavelength range is used may be a calculation of a ratio of the light amount at each sampling time point to the reference light amount of each wavelength. For example, the light amount change rate at each time point is calculated by setting each wavelength light amount at a start or at any time point of the etching as the reference. In addition, a specific light amount in another processing instead of the processing may be used as the reference. For example, when many wafers 16 are processed with the same apparatus, a reference light amount may be acquired in a first process, and the light amount change rate at each time point of each process may be calculated using the reference light amount. In this case, a long-term light amount drift of the external light source due to that there are many processes can also be corrected.

The light amount correction in the first wavelength range using the light amount change rate is performed by dividing the light amount of each wavelength in the first wavelength range by the light amount change rate at the time point. Here, for a light amount fluctuation detection light, a method of directly measuring the branched light of the external light source with a spectroscope may be used, and in addition, a reference light passing through the optical system may be measured with the spectroscope. For example, a light that passes through an optical transmission path equivalent to that of the light emitted to the wafer and that is reflected by an optical reflection surface different from the wafer is detected as the light amount fluctuation detection light. Accordingly, the light amount fluctuation noise generated in the optical transmission path of the light emitted to the wafer can also be measured by the light amount fluctuation detection light, and the light amount fluctuation noise generated in this optical transmission path can also be corrected based on the wafer reflected light.

The method of specifying the thickness and depth of the film to be processed on the wafer 16 in which the correction light amount of the first wavelength range acquired by these methods is used may be performed by comparing the correction light amount of each wavelength with data which is acquired in advance and in which the light amount of each wavelength and the remaining film thickness and depth of the film to be processed are associated with each other. When the data is acquired in advance in which the thickness and depth of the film to be processed and the pattern of the light amount of each wavelength are associated with each other, the correction light amount of each wavelength at any time point during the processing may be compared with the data acquired in advance to detect a pattern having a minimum difference, and the film thickness corresponding to the pattern may be determines as the remaining film thickness at the time point to specify the film thickness and depth at this time point.

When data is acquired in advance in which the thickness and depth of the film to be processed and the reflectance of each wavelength are associated with each other, the reflectance of each wavelength is calculated using the correction light amount of each wavelength and the light amount of each wavelength of the emitted external light, the calculated reflectance of each wavelength is compared with the data acquired in advance to detect a reflectance in the data having a minimum difference with the calculated reflectance, and the thickness of film and the depth is detected in the measurement by determining a thickness and depth associated with the detected reflectance in the data as the remaining film thickness. When data is acquired in advance in which the thickness and depth of the film to be processed and the first-order differential value or the second-order differential value of the light amount change of each wavelength are associated with each other, the first-order differential value or the second-order differential value of the correction light amount of each wavelength is acquired, and the first-order differential value or the second-order differential value may be compared to the data acquired in advance to specify the film thickness and depth at the time point.

When data is acquired in advance in which the thickness and depth of the film to be processed and the value of the first-order differential value or the second-order differential value of the light amount change of each wavelength that is normalized by the light amount are associated with each other, the first-order differential value or the second-order differential value of the correction light amount of each wavelength is acquired, and the first-order differential value or the second-order differential value may be compared to the data acquired in advance to specify the film thickness and depth at the time point. The method for correcting the light amount fluctuation noise of the external light source described above is not limited to the film thickness and depth measurement method, and can also be applied to spectroscopic measurement using the external light source. For example, in various types of measurement such as absorbance measurement, reflectance measurement, and scattering measurement, the light amount fluctuation noise of the external light source itself can also be corrected, and high accuracy of such measurement can also be realized.

Second Embodiment

A configuration of another embodiment of the invention will be described with reference to FIG. 7. FIG. 7 is a block diagram schematically showing an outline of a configuration for detecting a light amount, which indicates a sample processing state, using a light emitted to a vacuum processing chamber of a plasma processing apparatus according to another embodiment of the invention.

The present embodiment is different from the embodiment shown in FIGS. 1A and 2B in that the optical system 50 has the configuration shown in FIG. 7, and a fluctuation in the light amount of the light emitted along the optical system 50 from the light source unit 18 is corrected. Other configurations of the present embodiment are the same as those of the first embodiment.

In the present example, the light emitted from the light source unit 18 is branched into lights along two paths by a branching unit 1110, the light along one path is reflected by a wafer in the processing chamber 10 and is filtered by a combination unit 1113 into that in a specific wavelength range. The light along the other path is filtered by the combination unit 1113 into that in a specific wavelength range. These lights are combined at the combination unit 1113 and emitted to the detection unit 28.

In such a configuration, the branching unit 1110 uses, for example, a half mirror or a branch fiber, to separate the light into two parts each having the same spectrum. A wavelength selection mirror is used for the combination unit 1113, and the light passing through the processing chamber 10 and the light not passing through the processing chamber 10 are emitted to the wavelength selection mirror in different optical paths, so that the lights having respective exclusive wavelength ranges are combined and emitted to the detection unit 28. With the present configuration, the wafer reflected light passing through the processing chamber 10 and the light amount fluctuation detection light not passing through the processing chamber have different wavelength ranges, and are detected by the same detection unit 28.

In the present embodiment, in the path of the light not passing through processing chamber 10 of the optical system 50, the branching unit 1110 and the combination unit 1113 are connected only by an optical fiber, and the light output from the branching unit 1110 is introduced into the combination unit 1113 substantially without deterioration except for that caused by the optical fiber. Similarly, the detection lens 26 and the combination unit 1113 are connected by one or more optical fibers and are optically connected, and the light transmitted therebetween is introduced into the combination unit 1113 substantially without deterioration except for that caused by the optical fiber.

With the present configuration, a light amount fluctuation rate can be calculated using the light amount fluctuation detection light, the light amount of the light obtained based on the reflected light 24 can be corrected in accordance with the same operation and procedure as in the first embodiment, and light amount fluctuation correction and highly accurate film thickness and depth estimation are implemented as in the first embodiment.

It is obvious that the light source, dispersion measurement, a measurement condition, and a wafer condition used in the present embodiment are examples, and the invention can be applied to configurations and conditions other than these.

Third Embodiment

Figure 8A:
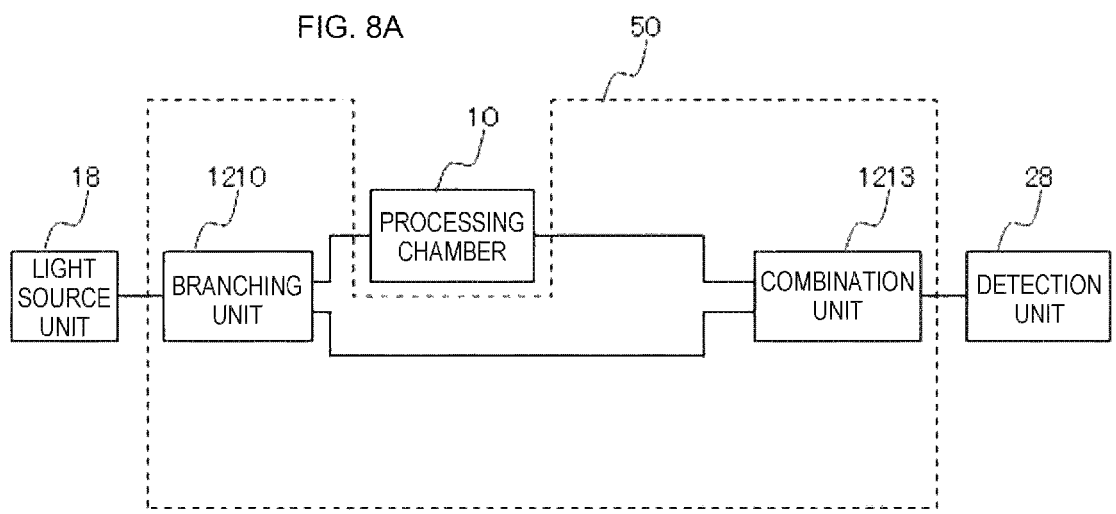
FIGS. 8A and 8B are block diagrams schematically showing an outline of a configuration for detecting a light amount, which indicates a sample processing state, using a light emitted to a vacuum processing chamber of a plasma processing apparatus according to still another embodiment of the invention.
Figure 8B:
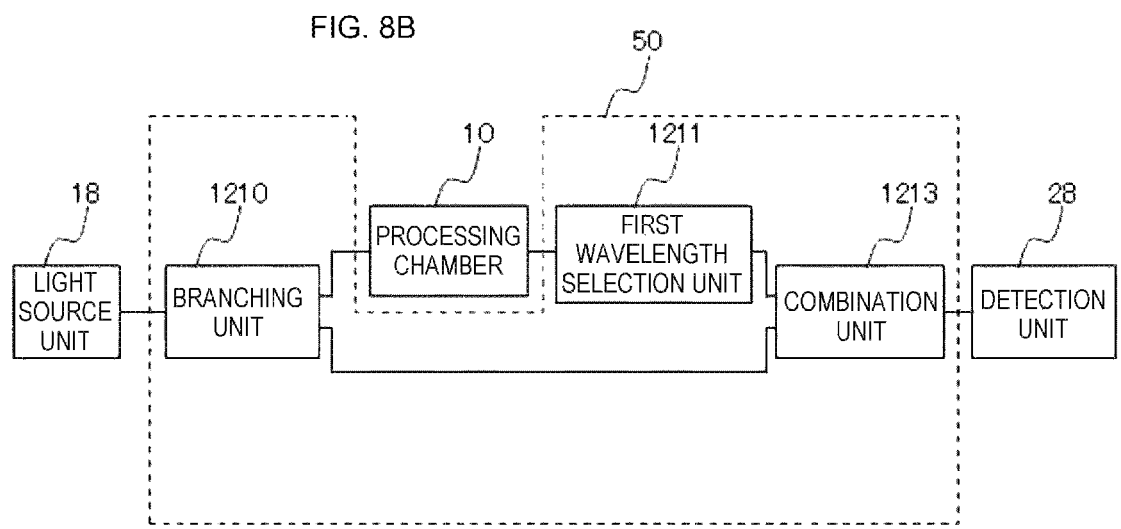

Next, a configuration of still another embodiment of the invention will be described with reference to FIGS. 8A and 8B. FIGS. 8A and 8B are block diagrams schematically showing an outline of a configuration for detecting a light amount, which indicates a sample processing state, using a light emitted to a vacuum processing chamber of a plasma processing apparatus according to still another embodiment of the invention.

The present embodiment is different from the embodiment shown in FIGS. 1A and 1B in that the optical system 50 has the configuration shown in FIG. 8A, and a fluctuation in the light amount of the light emitted along the optical system 50 from the light source unit 18 is corrected. Other configurations of the present embodiment are the same as those of the first embodiment.

In the present example, the light emitted from the light source unit 18 is filtered into that in a specified wavelength range and is branched into lights along two paths by a branching unit 1210. The light along one path is reflected by a wafer in the processing chamber 10, and the light along the other path is directly emitted to a combination unit 1213 and combined, and then emitted in the detection unit 28. In such a configuration, the branching unit 1210 uses, for example, a wavelength selection mirror, to separates the light into two lights having different spectrums. The combination unit 1213 uses a half mirror or a branch fiber. With the present configuration, the reflected light 24 passing through the processing chamber 10 and the light not passing through the processing chamber 10 have different wavelength ranges, and are detected by the same detection unit 28.

In the present embodiment, in the path of the light not passing through processing chamber 10 of the optical system 50, the branching unit 1210 and the combination unit 1213 are connected only by an optical fiber, and the light output from the branching unit 1210 is introduced into the combination unit 1213 substantially without deterioration except for that caused by the optical fiber. Similarly, a path shown in FIG. 8A between the detection lens 26 and the combination unit 1213, or paths shown in FIG. 8B between the detection lens 26 and a first wavelength selection unit 1211 and between the first wavelength selection unit 1211 and the combination unit 1213 are also connected by one or more optical fibers and are optically connected. The lights transmitted on these paths are introduced into the combination unit 1213 substantially without deterioration except for that caused by the optical fibers.

With the present configuration, a light amount fluctuation rate of the light from the light source unit 18 can be calculated using the light introduced into the combination unit 1213 without pass through processing chamber 10, the reflected light 24 can be corrected, and light amount fluctuation correction and highly accurate film thickness and depth estimation are implemented as in the first embodiment.

Here, when processing is performed in the processing chamber 10, in a case where a light such as the plasma 12 generated in the processing chamber 10 has a light in a predetermined wavelength range detected by the combination unit 1213 without passing through the processing chamber 10, an influence on a change in the reflectance of the wafer 16 caused by the light amount inside the processing chamber 10 is observed in the light in the predetermined wavelength range output from the combination unit 1213 without passing through the processing chamber 10, and the accuracy of correcting the fluctuation in the light amount may decrease. In such a case, the optical system 50 of FIG. 8B may be used. In FIG. 8B, as compared to FIG. 8A, a wavelength of the reflected light 24 passing through the process chamber 10 is selected again by the first wavelength selection unit 1211. Accordingly, by filtering the wavelength used to calculate the light amount change rate, highly accurate light amount fluctuation correction can be performed without being affected by the light generated in the processing chamber, and the highly accurate film thickness and depth estimation is implemented.

It is obvious that the light source, dispersion measurement, a measurement condition, and a wafer condition used in the present embodiment are examples, and the invention can be applied to configurations and conditions other than these.

Fourth Embodiment

Figure 9A:
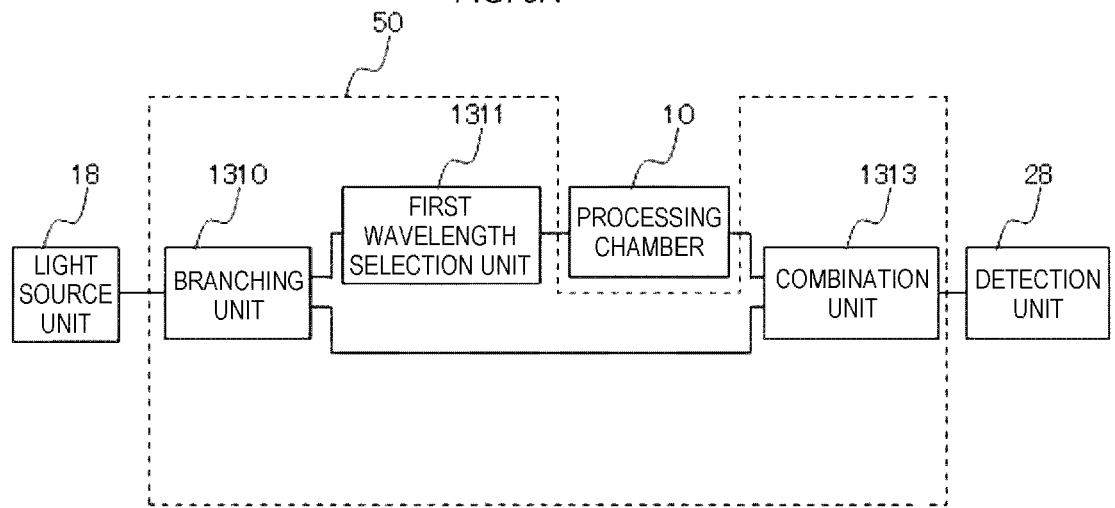
FIGS. 9A and 9B are block diagrams schematically showing an outline of a configuration for detecting a light amount, which indicates a sample processing state, using a light emitted to a vacuum processing chamber of a plasma processing apparatus according to still another embodiment of the invention.
Figure 9B:
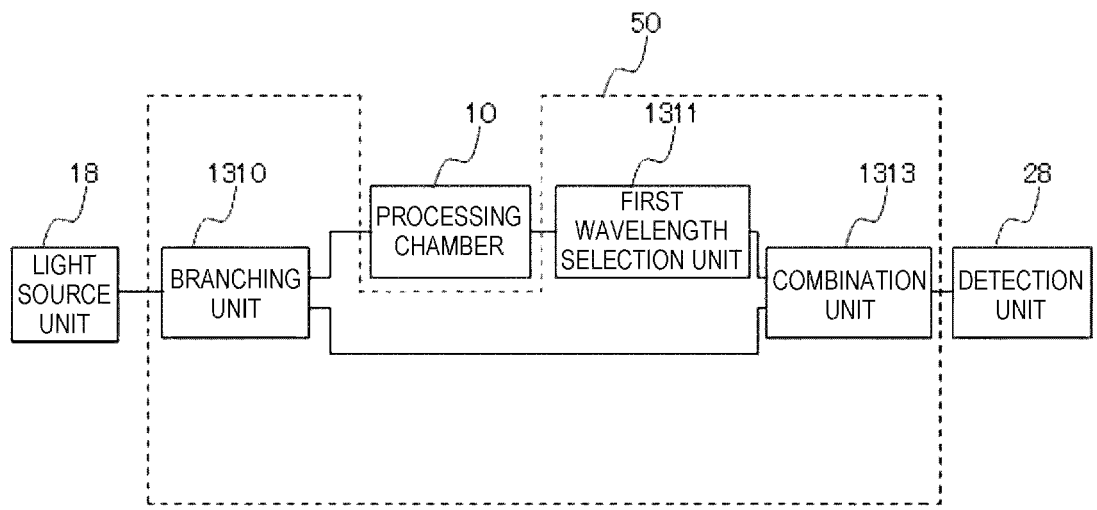

Next, a configuration of still another embodiment of the invention will be described with reference to FIGS. 9A and 9B. FIGS. 9A and 9B are block diagrams schematically showing an outline of a configuration for detecting a light amount, which indicates a sample processing state, using a light emitted to a vacuum processing chamber of a plasma processing apparatus according to still another embodiment of the invention.

The present embodiment is different from the embodiment shown in FIGS. 1A and 1B in that the optical system 50 has the configuration shown in FIG. 9A, and a fluctuation in the light amount of the light emitted along the optical system 50 from the light source unit 18 is corrected. Other configurations of the present embodiment are the same as those of the first embodiment.

In the present example, the light emitted from the light source unit 18 is branched into lights along two paths by a branching unit 1310. The light along one path is filtered into that in a specified wavelength by a first wavelength selection unit 1311 and reflected by a wafer in the processing chamber 10, and the light along the other path is directly emitted to a combination unit 1313. The lights combined by the combination unit 1313 is emitted to the detection unit 28.

In the present embodiment, in the path of the light not passing through processing chamber 10 of the optical system 50, the branching unit 1310 and the combination unit 1313 are connected only by an optical fiber, and the light output from the branching unit 1310 is introduced into the combination unit 1313 substantially without deterioration except for that caused by the optical fiber. Similarly, a path shown in FIG. 9A between the detection lens 26 and the combination unit 1313, or paths shown in FIG. 9B between the detection lens 26 and the first wavelength selection unit 1311 and between the first wavelength selection unit 1311 and the combination unit 1313 are also connected by one or more optical fibers and are optically connected. The lights transmitted on these paths are introduced into the combination unit 1313 substantially without deterioration except for that caused by the optical fibers.

In such a configuration, the branching unit 1310 uses, for example, a half mirror or a branch fiber, to separates the light into two lights. A wavelength filter is used for the first wavelength selection unit, and the light is filtered into that in a wavelength range used to calculate a light amount change rate. The combination unit 1313 uses a half mirror or a branch fiber.

With the present configuration, the wafer reflected light passing through the processing chamber 10 and the light amount fluctuation detection light not passing through the processing chamber have different wavelength ranges, and are detected by the same detection unit 28. Here, the light amount fluctuation detection light not passing through the processing chamber has a wavelength of the reflected light passing through the processing chamber 10. Therefore, in calculation of the light amount change rate, a part of the wavelengths of the light amount fluctuation detection light is used.

With the present configuration, the light amount fluctuation rate can be calculated using the light amount fluctuation detection light, the wafer reflected light can be corrected, and light amount fluctuation correction and highly accurate film thickness and depth estimation are implemented as in the first embodiment.

Here, when processing is performed in the processing chamber 10, in a case where a light such as the plasma 12 generated in the processing chamber 10 has a light in a predetermined wavelength range detected by the combination unit 1313 without passing through the processing chamber 10, an influence on a change in the reflectance of the wafer 16 caused by the light amount inside the processing chamber 10 is observed in the light in the predetermined wavelength range output from the combination unit 1313 without passing through the processing chamber 10, and the accuracy of correcting the fluctuation in the light amount may decrease. In such a case, the optical system 50 of FIG. 9B may be used. In FIG. 9B, as compared to FIG. 9A, a wavelength of the reflected light 24 passing through the process chamber 10 is selected again by the first wavelength selection unit 1311. Accordingly, by filtering the wavelength used to calculate the light amount change rate, highly accurate light amount fluctuation correction can be performed without being affected by the light generated in the processing chamber, and the highly accurate film thickness and depth estimation is implemented.

It is obvious that the light source, dispersion measurement, a measurement condition, and a wafer condition used in the present embodiment are examples, and the invention can be applied to configurations and conditions other than these.

REFERENCE SIGN LIST 10 processing chamber
12 plasma
14 sample table
16 wafer
18 light source unit
20 introduction lens
22 emitted light
24 reflected light
26 detection lens
28 detection unit
30 film thickness and depth calculation unit
40 control unit
50 optical system
100 plasma processing apparatus
1010 branching unit
1011 first wavelength selection unit
1012 second wavelength selection unit
1013 combination unit
100 first digital filter
102 differentiator
104 second digital filter
106 differential comparator
108 differential waveform pattern database
1110 branching unit
1113 combination unit
1210 branching unit
1213 combination unit
1211 first wavelength selection unit
1310 branching unit
1311 first wavelength selection unit
1313 combination unit

The invention claimed is:

1. A plasma processing apparatus configured to process, using plasma generated in a processing chamber inside a vacuum container, a film layer to be processed on a wafer disposed in the processing chamber, the plasma processing apparatus comprising:

a detector configured to detect, during processing of the wafer, an intensity of a first light of a plurality of wavelengths in a first wavelength range and an intensity of a second light of a plurality of wavelengths in a second wavelength range which includes at least one wavelength different from each of the plurality of wavelengths in the first wavelength range, the first light being obtained by receiving a light which is emitted into the processing chamber from a light source disposed outside the processing chamber and which is reflected by an upper surface of the wafer, and the second light being a light transmitted from the light source without passing through the processing chamber; and a determination unit configured to determine a remaining film thickness of the film layer by comparing the intensity of the first light in the first wavelength range, that is obtained during the processing and corrected by using a change rate of the intensity of the second light in the second wavelength range, with pattern data which is obtained in advance and indicates a correlation between an intensity of a light and a remaining film thickness of the film layer where a wavelength is used as a parameter.

2. The plasma processing apparatus according to claim 1, further comprising:

a combination unit configured to output, to the detector, a light obtained by combining the first light and the second light.

3. The plasma processing apparatus according to claim 1, further comprising:

a branching unit by which the light from the light source branches into one in a first path and one in a second path, wherein the first path includes a path from the branching unit to the detector into which the light is introduced as the first light after being emitted into the processing chamber and reflected by the wafer, and the second path includes a path from the branching unit to the detector into which the light passing through an outside of the processing chamber is introduced as the second light.

4. The plasma processing apparatus according to claim 3, further comprising:

a filter disposed on the first path outside the processing chamber and configured to limit a wavelength range of the light from the light source to the first wavelength range.

5. The plasma processing apparatus according to claim 3, further comprising:

a filter disposed on the second path outside the processing chamber and configured to limit a wavelength range of the light from the light source to the second wavelength range.

6. A plasma processing method of disposing a wafer in a processing chamber inside a vacuum container, and processing a film layer to be processed on the wafer using plasma generated in the processing chamber, the plasma processing method comprising:

detecting, during processing of the wafer, an intensity of a first light of a plurality of wavelengths in a first wavelength range and an intensity of a second light of a plurality of wavelengths in a second wavelength range which includes at least one wavelength different from each of the plurality of wavelengths in the first wavelength range, the first light being obtained by receiving a light which is emitted into the processing chamber from a light source disposed outside the processing chamber and which is reflected by an upper surface of the wafer, and the second light being a light transmitted from the light source without passing through the processing chamber; and determining a remaining film thickness of the film layer by comparing the intensity of the first light in the first wavelength range, that is obtained during the processing and corrected by using a change rate of the intensity of the second light in the second wavelength range, with pattern data which is obtained in advance and indicates a correlation between an intensity of a light and a remaining film thickness of the film layer where a wavelength is used as a parameter.

7. The plasma processing method according to claim 6, wherein the intensity of the first light is corrected by using a change rate of an amount of the second light detected based on a light obtained by combining the first light and the second light.

8. The plasma processing method according to claim 6, wherein the light from the light source branches into one in a first path and one in a second path, a light passing through the first path is detected as the first light after being branched and emitted to the processing chamber, and reflected by the wafer, and a light passing through the second path passes through an outside of the processing chamber from the branching unit and is detected as the second light.

9. The plasma processing method according to claim 8, wherein a wavelength range of the light from the light source is limited to the first wavelength range on the first path outside the processing chamber.

10. The plasma processing method according to claim 8, wherein a wavelength range of the light from the light source is limited to the second wavelength range on the second path outside the processing chamber.

* * * * *